(12) United States Patent
Tsai

(10) Patent No.: US 8,937,376 B2
(45) Date of Patent: Jan. 20, 2015

(54) SEMICONDUCTOR PACKAGES WITH HEAT DISSIPATION STRUCTURES AND RELATED METHODS

(75) Inventor: Fu-Yung Tsai, Xizhou Township (TW)

(73) Assignee: Advanced Semiconductor Engineering, Inc., Kaohsiung (TW)

(*) Notice: Subject to any disclaimer, the term of this patent is extended or adjusted under 35 U.S.C. 154(b) by 42 days.

(21) Appl. No.: 13/448,059

(22) Filed: Apr. 16, 2012

(65) Prior Publication Data

US 2013/0270683 A1 Oct. 17, 2013

(51) Int. Cl.
*H01L 23/495* (2006.01)

(52) U.S. Cl.
USPC .................. 257/670; 257/675; 257/E23.175

(58) Field of Classification Search
USPC .............. 257/670, 675, 676, 706, 710, 711, 257/E23.175, E23.178, E23.151; 438/123
See application file for complete search history.

(56) References Cited

U.S. PATENT DOCUMENTS

| | | |
|---|---|---|
| 4,569,786 A | 2/1986 | Deguchi |
| 4,814,205 A | 3/1989 | Arcilesi et al. |
| 5,166,772 A | 11/1992 | Soldner et al. |
| 5,353,498 A | 10/1994 | Fillion et al. |
| 5,355,016 A | 10/1994 | Swirbel et al. |
| 5,371,404 A | 12/1994 | Juskey et al. |
| 5,557,142 A | 9/1996 | Gilmore et al. |
| 5,639,989 A | 6/1997 | Higgins, III |
| 5,677,511 A | 10/1997 | Taylor et al. |
| 5,694,300 A | 12/1997 | Mattei et al. |
| 5,776,798 A | 7/1998 | Quan et al. |
| 5,886,876 A | 3/1999 | Yamaguchi |
| 5,895,229 A | 4/1999 | Carney et al. |
| 5,998,867 A | 12/1999 | Jensen et al. |
| 6,093,960 A | 7/2000 | Tao et al. |
| 6,093,972 A | 7/2000 | Carney et al. |
| 6,150,193 A | 11/2000 | Glenn |
| 6,191,360 B1 | 2/2001 | Tao et al. |
| 6,225,694 B1 | 5/2001 | Terui |
| 6,229,702 B1 | 5/2001 | Tao et al. |
| 6,376,769 B1 | 4/2002 | Chung |
| 6,429,512 B1 | 8/2002 | Huang et al. |
| 6,444,498 B1 | 9/2002 | Huang et al. |
| 6,458,626 B1 | 10/2002 | Huang et al. |
| 6,483,187 B1 | 11/2002 | Chao et al. |
| 6,528,882 B2 | 3/2003 | Ding et al. |
| 6,541,310 B1 | 4/2003 | Lo et al. |
| 6,552,428 B1 * | 4/2003 | Huang et al. .................. 257/706 |
| 6,586,822 B1 | 7/2003 | Vu et al. |
| 6,614,102 B1 | 9/2003 | Hoffman et al. |

(Continued)

FOREIGN PATENT DOCUMENTS

| | | |
|---|---|---|
| JP | 08-288686 | 1/1996 |
| WO | WO2004060034 | 7/2004 |

*Primary Examiner* — Tucker Wright
(74) *Attorney, Agent, or Firm* — Klein, O'Neil & Singh, LLP

(57) ABSTRACT

Semiconductor packages including a die pad, at least one connecting bar, at least one supporting portion, a plurality of leads, a semiconductor chip, a heat sink and a molding compound. The connecting bar connects the die pad and the supporting portion. The leads are electrically isolated from each other and the die pad. The semiconductor chip is disposed on the die pad and electrically connected to the leads. The heat sink is supported by the supporting portion. The molding compound encapsulates the semiconductor chip and the heat sink. Heat from the semiconductor chip is efficiently dissipated from the die pad through the connecting bar, through the supporting portion, and through the heat sink.

19 Claims, 9 Drawing Sheets

(56) References Cited

U.S. PATENT DOCUMENTS

| | | |
|---|---|---|
| 6,740,546 B2 | 5/2004 | Corisis et al. |
| 6,740,959 B2 | 5/2004 | Alcoe et al. |
| 6,757,181 B1 | 6/2004 | Villanueva et al. |
| 6,781,231 B2 | 8/2004 | Minervini |
| 6,801,429 B2 | 10/2004 | Tsai et al. |
| 6,828,687 B2 | 12/2004 | Ding |
| 6,838,776 B2 | 1/2005 | Leal et al. |
| 6,844,622 B2 | 1/2005 | Hsiao et al. |
| 6,865,084 B2 | 3/2005 | Lin et al. |
| 6,881,896 B2 | 4/2005 | Ebihara |
| 6,918,178 B2 | 7/2005 | Chao et al. |
| 6,933,993 B2 | 8/2005 | Peng et al. |
| 6,936,930 B2 | 8/2005 | Wang |
| 6,946,729 B2 | 9/2005 | Lee et al. |
| 6,949,413 B2 | 9/2005 | Lo et al. |
| 6,949,414 B2 | 9/2005 | Lo et al. |
| 6,951,776 B2 | 10/2005 | Lo et al. |
| 6,962,869 B1 | 11/2005 | Bao et al. |
| 6,967,403 B2 | 11/2005 | Chuang et al. |
| 6,998,532 B2 | 2/2006 | Kawamoto et al. |
| 7,002,246 B2 | 2/2006 | Ho et al. |
| 7,002,805 B2 | 2/2006 | Lee et al. |
| 7,005,749 B2 | 2/2006 | Hsu et al. |
| 7,009,288 B2 | 3/2006 | Bauer et al. |
| 7,015,577 B2 | 3/2006 | Wang |
| 7,025,848 B2 | 4/2006 | Wang |
| 7,026,719 B2 | 4/2006 | Wang |
| 7,030,469 B2 | 4/2006 | Mahadevan et al. |
| 7,034,388 B2 | 4/2006 | Yang et al. |
| 7,037,750 B2 | 5/2006 | Tsai et al. |
| 7,045,385 B2 | 5/2006 | Kim et al. |
| 7,045,395 B2 | 5/2006 | Lo et al. |
| 7,061,079 B2 | 6/2006 | Weng et al. |
| 7,071,553 B2 | 7/2006 | Tsai et al. |
| 7,074,645 B2 | 7/2006 | Huang et al. |
| 7,081,661 B2 | 7/2006 | Takehara et al. |
| 7,122,911 B2 | 10/2006 | Yang |
| 7,125,744 B2 | 10/2006 | Takehara et al. |
| 7,161,252 B2 | 1/2007 | Tsuneoka et al. |
| 7,163,840 B2 | 1/2007 | Chen et al. |
| 7,164,210 B2 | 1/2007 | Tsai et al. |
| 7,186,928 B2 | 3/2007 | Kikuchi et al. |
| 7,187,060 B2 | 3/2007 | Usui |
| 7,224,057 B2 | 5/2007 | Yang |
| 7,250,676 B2 | 7/2007 | Wang |
| 7,256,494 B2 | 8/2007 | Huang et al. |
| 7,259,445 B2 | 8/2007 | Lau et al. |
| 7,259,456 B2 | 8/2007 | Wang |
| 7,327,015 B2 | 2/2008 | Yang et al. |
| 7,335,982 B2 | 2/2008 | Kao et al. |
| 7,342,303 B1 | 3/2008 | Berry et al. |
| 7,355,289 B2 | 4/2008 | Hess et al. |
| 7,365,422 B2 | 4/2008 | Liu et al. |
| 7,411,790 B2 | 8/2008 | Huang |
| 7,446,409 B2 | 11/2008 | Yang |
| 7,451,539 B2 | 11/2008 | Morris et al. |
| 7,478,474 B2 | 1/2009 | Koga |
| 7,482,204 B2 | 1/2009 | Kao et al. |
| 7,488,903 B2 | 2/2009 | Kawagishi et al. |
| 7,572,680 B2 | 8/2009 | Hess et al. |
| 7,576,415 B2 | 8/2009 | Cha et al. |
| 7,629,674 B1 | 12/2009 | Foster |
| 7,633,170 B2 | 12/2009 | Yang et al. |
| 7,633,765 B1 | 12/2009 | Scanlan et al. |
| 1,765,604 A1 | 2/2010 | Yang et al. |
| 7,692,290 B2 | 4/2010 | Chang et al. |
| 7,700,411 B2 | 4/2010 | Yang et al. |
| 7,745,910 B1 | 6/2010 | Olson et al. |
| 7,759,805 B2 | 7/2010 | Beer et al. |
| 7,763,959 B2 | 7/2010 | Liu et al. |
| 7,816,773 B2 | 10/2010 | Liu |
| 7,820,468 B2 | 10/2010 | Lee et al. |
| 7,829,981 B2 | 11/2010 | Hsu |
| 7,830,026 B2 | 11/2010 | Beer et al. |
| 2004/0020673 A1 | 2/2004 | Mazurkiewicz |
| 2004/0150097 A1 | 8/2004 | Gaynes et al. |
| 2004/0178500 A1 | 9/2004 | Usui |
| 2004/0231872 A1 | 11/2004 | Arnold et al. |
| 2004/0252475 A1 | 12/2004 | Tsuneoka et al. |
| 2005/0013082 A1 | 1/2005 | Kawamoto et al. |
| 2005/0029673 A1 | 2/2005 | Naka et al. |
| 2005/0039946 A1 | 2/2005 | Nakao |
| 2005/0045358 A1 | 3/2005 | Arnold |
| 2005/0208702 A1 | 9/2005 | Kim |
| 2006/0145361 A1 | 7/2006 | Yang et al. |
| 2006/0266547 A1 | 11/2006 | Koga |
| 2006/0278964 A1* | 12/2006 | Anacleto et al. ............ 257/678 |
| 2007/0200206 A1* | 8/2007 | Wong et al. ................. 257/666 |
| 2008/0042301 A1 | 2/2008 | Yang et al. |
| 2008/0061407 A1 | 3/2008 | Yang et al. |
| 2008/0174013 A1 | 7/2008 | Yang et al. |
| 2009/0000114 A1 | 1/2009 | Rao et al. |
| 2009/0000815 A1 | 1/2009 | Hiner et al. |
| 2009/0000816 A1 | 1/2009 | Hiner et al. |
| 2009/0002969 A1 | 1/2009 | Madsen et al. |
| 2009/0002970 A1 | 1/2009 | Leahy et al. |
| 2009/0002971 A1 | 1/2009 | Carey et al. |
| 2009/0002972 A1 | 1/2009 | Carey et al. |
| 2009/0025211 A1 | 1/2009 | Hiner et al. |
| 2009/0035895 A1 | 2/2009 | Lee et al. |
| 2009/0102003 A1 | 4/2009 | Vogt et al. |
| 2009/0102033 A1 | 4/2009 | Raben |
| 2009/0152696 A1* | 6/2009 | Dimasacat et al. ......... 257/676 |
| 2009/0194851 A1 | 8/2009 | Chiu et al. |
| 2009/0194852 A1 | 8/2009 | Chiu et al. |
| 2009/0230487 A1 | 9/2009 | Saitoh et al. |
| 2009/0230523 A1 | 9/2009 | Chien et al. |
| 2009/0230524 A1 | 9/2009 | Chien et al. |
| 2009/0230525 A1 | 9/2009 | Chien et al. |
| 2009/0230526 A1 | 9/2009 | Chen et al. |
| 2009/0236700 A1 | 9/2009 | Moriya |
| 2009/0256244 A1 | 10/2009 | Liao et al. |
| 2010/0006330 A1 | 1/2010 | Fu et al. |
| 2010/0013064 A1 | 1/2010 | Hsu |
| 2010/0032815 A1 | 2/2010 | An et al. |
| 2010/0109132 A1 | 5/2010 | Ko et al. |
| 2010/0110656 A1 | 5/2010 | Ko et al. |
| 2010/0199492 A1 | 8/2010 | Hiner et al. |
| 2010/0207257 A1 | 8/2010 | Lee |
| 2010/0207258 A1 | 8/2010 | Eun et al. |
| 2010/0207259 A1 | 8/2010 | Liao et al. |
| 2011/0115059 A1 | 5/2011 | Lee et al. |
| 2011/0115060 A1 | 5/2011 | Chiu et al. |
| 2011/0115066 A1 | 5/2011 | Kim et al. |
| 2011/0127654 A1 | 6/2011 | Weng et al. |

* cited by examiner

SEMICONDUCTOR PACKAGES WITH HEAT DISSIPATION STRUCTURES AND RELATED METHODS

TECHNICAL FIELD

The present embodiments relate to semiconductor packages and a related methods, and more particularly to semiconductor packages having a heat sink, and related methods.

BACKGROUND

Flat No leads packages, such as Quad Flat No leads (QFN), operationally couple integrated circuits to printed circuit boards. Conventional QFN packages include a semiconductor chip, a die pad upon which the chip is located, a plurality of bonding wires, a plurality of leads, and a package body. The bonding wires electrically connect the chip to upper surfaces of the leads. The lower surfaces of the leads are exposed outside the package body and used as external contacts for the QFN package. The leads are generally arranged in a perimeter array surrounding the chip so as to increase lead density. However, the chip is encapsulated by the package body, which is typically a material that has poor heat conducting properties. But, the chip generates heat during operation, and this heat must be dissipated to avoid degrading the chip's performance. Thus, heat dissipation is a critical issue for conventional QFN packages.

SUMMARY

One of the present embodiments comprises a semiconductor package including a die pad and at least one connecting bar extending outwardly from the die pad. At least one supporting portion extends from the at least one connecting bar at a location spaced from the die pad, and includes an upper surface that is elevated above an upper surface of the die pad. A plurality of leads is disposed around the die pad and electrically isolated from each other and the die pad. A semiconductor chip is disposed on the die pad and electrically connected to the leads. A heat sink is attached to the upper surface of the at least one supporting portion. A molding compound encapsulates the semiconductor chip, at least portions of the heat sink, at least portions of the die pad, at least portions of the connecting bar, at least portions of the supporting portion, and at least portions of each of the leads.

Another of the present embodiments comprises a semiconductor package including a die pad and at least one connecting bar extending outwardly from the die pad. At least one supporting portion extends from the at least one connecting bar at a distal end from the die pad. A plurality of leads is disposed around the die pad and electrically isolated from each other and the die pad. A semiconductor chip is disposed on the die pad and electrically connected to the leads. A heat sink is attached to an upper surface of the at least one supporting portion. The heat sink comprises a main body portion and at least one leg portion. A molding compound encapsulates the semiconductor chip, at least portions of the heat sink, at least portions of the die pad, at least portions of the connecting bar, at least portions of the supporting portion, and at least portions of each of the leads. A path for dissipating heat from the semiconductor chip comprises from the die pad through the at least one connecting bar, through the at least one supporting portion, through the at least one leg portion, and through the main body portion.

Another of the present embodiments comprises a method of making, a semiconductor package. The method comprises providing a metal plate including a base, a central protrusion, a plurality of peripheral protrusions, a plurality of supporting protrusions, a first metal layer and a second metal layer. The base has a plurality of connecting portions extending between the central protrusion and the supporting protrusions. The central protrusion has an upper surface and extends upwardly from the base so as to define a cavity. Each of the peripheral protrusions has an upper surface, extends upwardly from the base, and is disposed around the central protrusion. Each of the supporting protrusions has an upper surface, extends upwardly from the base, and is disposed around the central protrusion. The first metal layer is formed on the upper surfaces of the central protrusion, the peripheral protrusions, and the supporting protrusions. The second metal layer is formed on the lower surface of the metal plate below the cavity, the central protrusion, the connecting portions, the supporting protrusions, and the peripheral protrusions. The method further comprises securing a semiconductor chip within the cavity. The method further comprises electrically connecting the semiconductor chip to the peripheral protrusions. The method further comprises securing a heat sink to the metal plate. The heat sink has a main body and a plurality of leg portions. The main body is disposed above the semiconductor chip, and the leg portions extend from the main body and are supported by the supporting protrusions. The method further comprises forming a molding compound over the metal plate so as to cover the semiconductor chip, the heat sink, the central protrusion, the peripheral protrusions, the supporting protrusions and the first metal layer. The method further comprises etching the lower surface of the metal plate so as to form a die pad, a plurality of connecting bars, a plurality of supporting portions, and a plurality of leads. The connecting bars connect the die pad and the supporting portions, and the leads are disposed around the die pad and electrically isolated from each other and from the die pad.

BRIEF DESCRIPTION OF THE DRAWINGS

Common reference numerals are used throughout the drawings and the detailed description to indicate the same elements. The present invention will be more apparent from the following detailed description taken in conjunction with the accompanying drawings.

DETAILED DESCRIPTION

Figure 1:
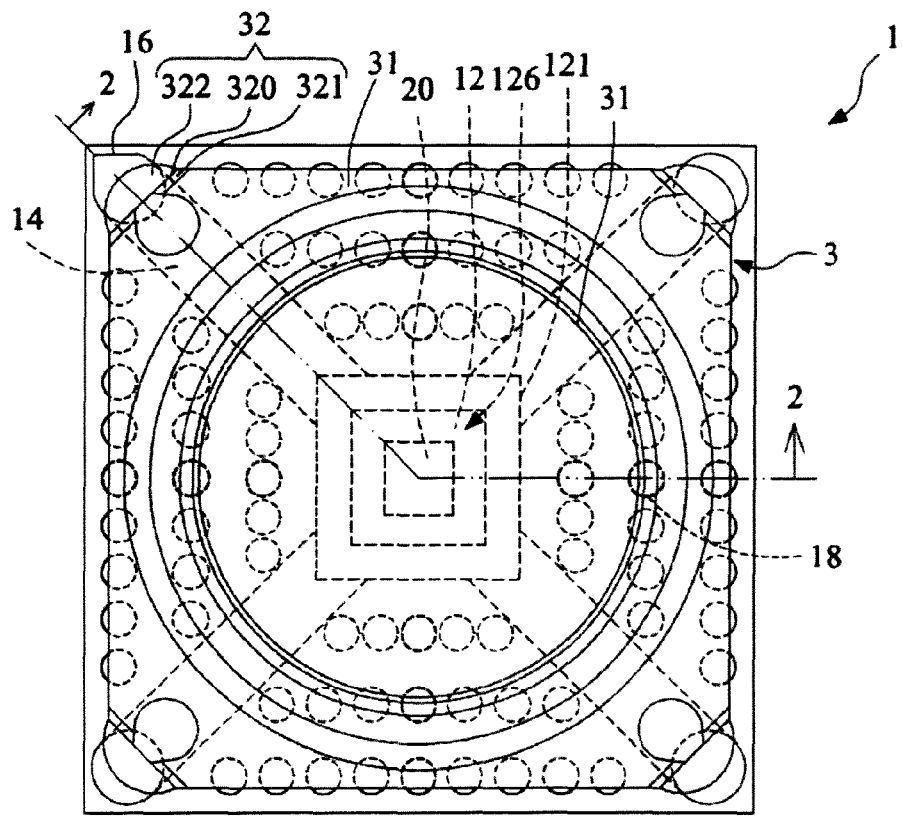
FIG. 1 is a top plan view of a semiconductor package according to the present embodiments.
Figure 2:
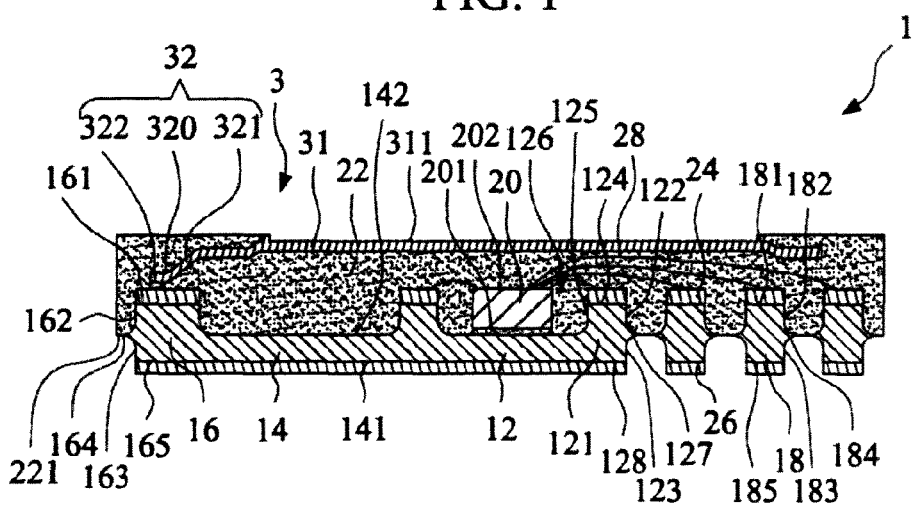
FIG. 2 is a cross-sectional side view of the semiconductor package of FIG. 1, taken along line 2-2 in FIG. 1.
Figure 3:
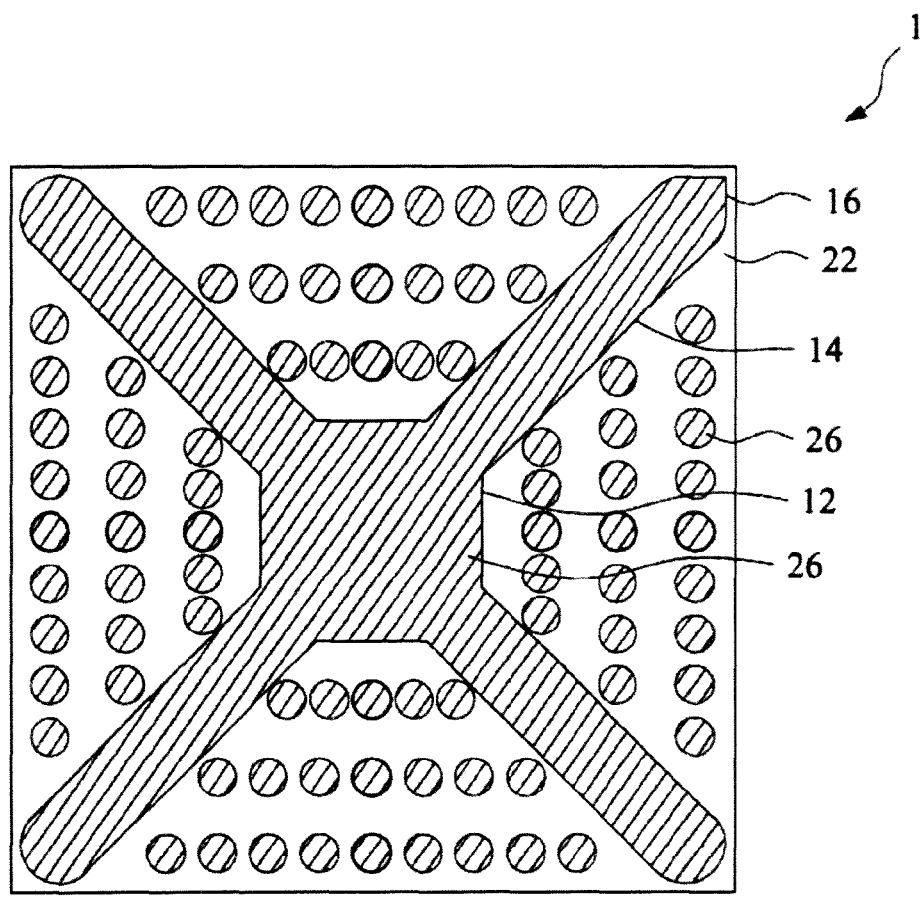
FIG. 3 is a bottom plan view of the semiconductor package of FIG. 1.

Referring to FIGS. 1-3, a top view, a cross-sectional side view, and a bottom plan view of a semiconductor package 1 according to the present embodiments is illustrated. The cross-section of the semiconductor package 1 shown in FIG. 2 is taken along the line 2-2 in FIG. 1. The semiconductor package 1 includes a die pad 12, at least one connecting bar 14, at least one supporting portion 16, a plurality of leads 18, a semiconductor chip 20, a molding compound 22, a plurality of bonding wires 28, and a heat sink 3. For clarity, FIG. 1 omits the bonding wires 28 and the molding compound 22 shown in FIG. 2.

With reference to FIG. 1, the die pad 12 includes a peripheral edge region 121 that defines a cavity 126 in which the semiconductor chip 20 is disposed. The leads 18 are disposed around the die pad 12, and electrically isolated from each other and the die pad 12. The supporting portion 16 is disposed at the corner of the semiconductor package 1. The connecting bar 14 extends from the die pad 12 outwardly, so that the connecting bar 14 connects the die pad 12 and the supporting portion 16.

The heat sink 3 includes a main body 31 and at least one leg portion 32. The main body 31 is disposed above the semiconductor chip 20. The leg portion 32 extends from the main body 31, and is disposed at the corners of the semiconductor package 1 and supported by the supporting portions 16.

With reference to FIG. 2, the die pad 12 includes the peripheral edge region 121, which defines the cavity 126 in which the semiconductor chip 20 is disposed. The peripheral edge region 121 may completely surround the cavity 126, or in other embodiments may only partially surround the cavity 126. The die pad 12 further includes an outer upper side wall 122, a lower side wall 123, a peak 127 at the juncture of the side walls 122, 123, a lower surface 128, an upper surface 124, and an inner upper side wall 125. The inner upper side wall 125 is disposed adjacent to the upper surface 124 and faces toward the cavity 126. The outer upper side wall 122 is disposed adjacent to the upper surface 124 and faces away from the cavity 126. The lower side wall 123 is disposed adjacent to the upper side wall 122 and faces away from the cavity 126. The side walls 122, 123, 125 may be linear or curved, and are typically non-perpendicular to the upper surface 124 of the peripheral edge region 121. The upper side wall 122 and the lower side wall 123 meet at the peak 127.

As discussed above, the connecting bar 14 connects the die pad 12 and the supporting portion 16. The connecting bar 14 includes an upper surface 142 and a lower surface 141 opposite each other. The upper surface 142 has a lower elevation than the upper surface 124 of the peripheral edge region 121, and is coplanar with the bottom of the cavity 126 of the die pad 12. The lower surface 141 is coplanar with the lower surface 128 of the die pad 12.

The supporting portion 16 includes an upper surface 161, an upper side wall 162, a lower side wall 163, a peak 164 at the juncture of the side walls 162, 163, and a lower surface 165. The upper side wall 162 is disposed adjacent to the upper surface 161 and faces away from the die pad 12. The lower side wall 163 is disposed adjacent to the upper side wall 162 and faces away from the die pad 12. The side walls 162, 163 may be linear or curved, and are typically non-perpendicular to the upper surface 161. The upper side wall 162 and the lower side wall 163 meet at the peak 164. The lower surface 165 is coplanar with the lower surface 128 of the die pad 12 and the lower surface 141 of the connecting bar 14. In the illustrated embodiment, the die pad 12, the connecting bar 14 and the supporting portion 16 are made integrally, but in other embodiments they could be formed separately. The width of the connecting bar 14 is the same as the width of the supporting portion 16. Alternatively, the width of the connecting bar 14 can be smaller than the diameter of the supporting portion 16.

Each of the leads 18 further includes an upper surface 181, an upper side wall 182, a lower side wall 183, a peak 184 at the juncture of the side walls 182, 183, and a lower surface 185. The upper side wall 182 is disposed adjacent to the upper surface 181, may be linear or curved, and is typically non-perpendicular to the upper surface 181. The lower side wall 183 is disposed adjacent to the lower surface 185, may be linear or curved, and is typically non-perpendicular to the lower surface 185. The upper side wall 182 and the lower side wall 183 meet at the peak 184, in the illustrated embodiment, the surface area of the supporting portion 16 is greater than that of each of the leads 18. In alternative embodiments, however, the surface area of the supporting portion 16 may be equal to or less than that of each of the leads 18.

A first metal layer 24 is disposed on the upper surfaces 161, 181, 124, respectively, of the supporting portion 16, the leads 18, and the peripheral edge region 121. The first metal layer 24 can be applied using any technique, such as electrolytic plating or electroless plating. The metal layer 24 may include, for example, a layer of nickel in contact with the upper surfaces 161, 181, 124, and a layer of gold or palladium covering the layer of nickel. Alternatively, the metal layers 24 may include a layer of an alloy of nickel and either one of, or both, gold and palladium. It is desirable that the first metal layer 24 adhere well and enable effective wire bonding with the bonding wires 28.

A second metal layer 26 is disposed on the lower surfaces 128, 141, 165, 185, respectively, of the die pad 12, the connecting bar 14, the supporting portion 16, and the leads 18. In this embodiment, the lower surfaces 128, 141, 165 are coplanar and form an integral lower surface on which the second metal layer 26 is disposed. The second metal layer 26 may comprise the same materials discussed above with respect to the first metal layer 24, and may be applied using the same techniques. The second metal layer 26 adheres well and protects the lower surfaces 128, 141, 165, 185 from oxidation and other environmental conditions.

An adhesive layer 201 secures the semiconductor chip 20 to the bottom of the cavity 126 of the die pad 12. The adhesive layer 201 may be a conductive or a non-conductive adhesive material, such as silver paste and non-conductive epoxy. The active surface of the semiconductor chip 20 is electrically connected to the leads 18 by the bonding wires 28, and may also be electrically connected to the peripheral edge region 121 by the bonding wires 28 for grounding.

The heat sink 3 includes the main body 31 and the leg portions 32. The main body 31 and the leg portions 32 define a space for accommodating the semiconductor chip 20, and the leg portions 32 are supported by the supporting portions 16. In the illustrated embodiment, the leg portions 32 include a bend 320 to form a first portion 321 and a second portion 322. The first portion 321 extends from the main body 31, and the second portion 322 is supported by the supporting portion 16 with an inclination angle at the bend 320.

The molding compound 22 encapsulates the semiconductor chip 20, the heat sink 3, portions of the die pad 12, portions of the connecting bar 14, portions of the supporting portion 16, and portions of each of the leads 18. The lower side wall 183 of the lead 18, the lower side wall 123 of the die pad 12, the lower side wall 163 of the supporting portion 16, and the connecting bar 14 extend outwardly from a lower surface 221 of the molding compound 22. In the illustrated embodiment, the upper surface 311 of the main body 31 of the heat sink 3 is not covered by the molding compound 22 and is exposed to the air.

With reference to FIG. 3, in this embodiment, the semiconductor package 1 includes four connecting bars 14 and four supporting portions 16, and the die pad 12 is substantially square. The hatching in FIG. 3 indicates that the metal layer 26 has been exposed from the molding compound 22.

In the semiconductor package 1, the path for dissipating the heat from the semiconductor chip 20 comprises: from the die pad 12 through the connecting bars 14, through the supporting portions 16, through the leg portions 32 of the heat sink 3, and through the main body 31 of the heat sink 3, all of which are materials that conduct heat well, such as metals. Thus, the heat from the semiconductor chip 20 can be dissipated outwardly efficiently. Further, a vertical thickness of each of the supporting portions 16 is greater than a vertical thickness of the connecting bars 14 such that the upper surface 161 of each supporting portion 16 is elevated above the connecting bars 14. This elevation reduces the extent to which the leg portions 32 need to extend downward from the main body 31, such that the heat sink need not be bent to sharp angles in the regions of the leg portions 32, which reduces making costs.

In certain embodiments, one of the supporting portions 16 may be of a different shape and/or size from the other supporting portions 16. This supporting portion 16 may serve as a recognition mark to facilitate proper orientation, during surface mounting, of a resulting package.

Figure 4:
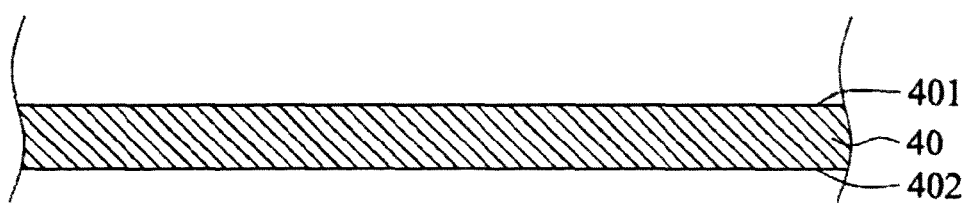
FIGS. 4-17 are top plan and cross-sectional side views showing steps in a method of making a semiconductor package according to the present embodiments.

Referring to FIGS. 4-17, steps in a method of making a semiconductor package according to one of the present embodiments are illustrated. With reference to FIG. 4, the process begins with a plate 40 having an upper surface 401 and a lower surface 402. The material of the plate may be a metal, such as copper, a copper alloy, or any other material.

Figure 5:
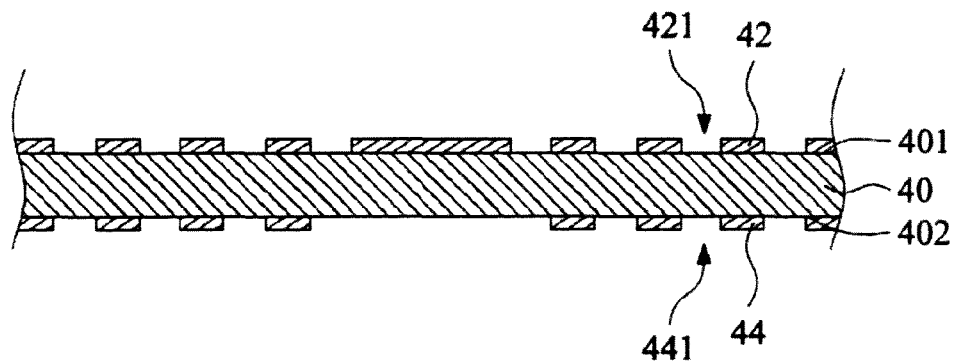

With reference to FIG. 5, a first photoresist layer 42 is applied on the upper surface 401 of the plate 40, and a second photoresist layer 44 is applied on the lower surface 402 of the plate 40. The photoresist layers 42, 44 may be formed by coating, printing, or any other suitable technique. The photoresist layers 42, 44 are patterned so that the first photoresist layer 42 has a plurality of first openings 421 to expose portions of the upper surface 401 of the plate 40, and the second photoresist layer 44 has a plurality of second openings 441 to expose portions of the lower surface 402 of the plate 40. The patterning may be performed by photolithography, for example, or any other suitable technique.

Figure 6:
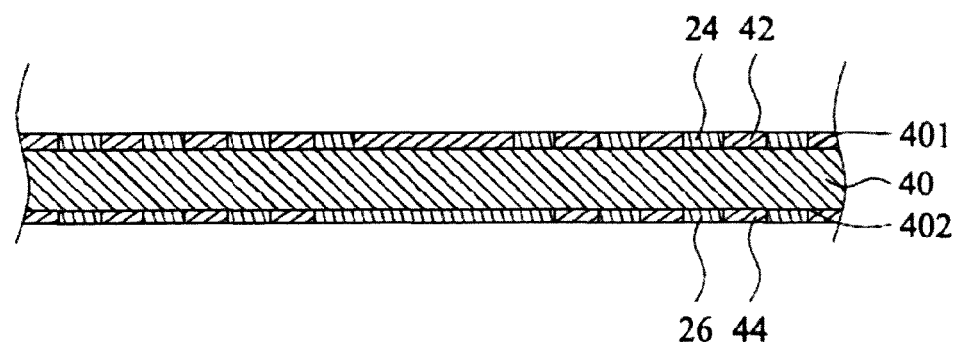
Figure 7:
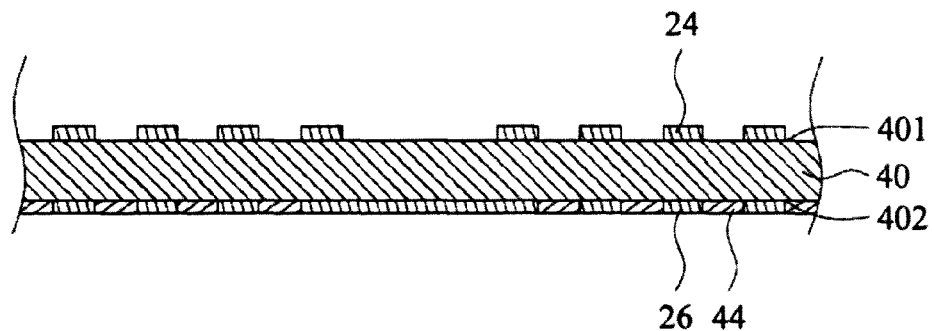
Figure 8:
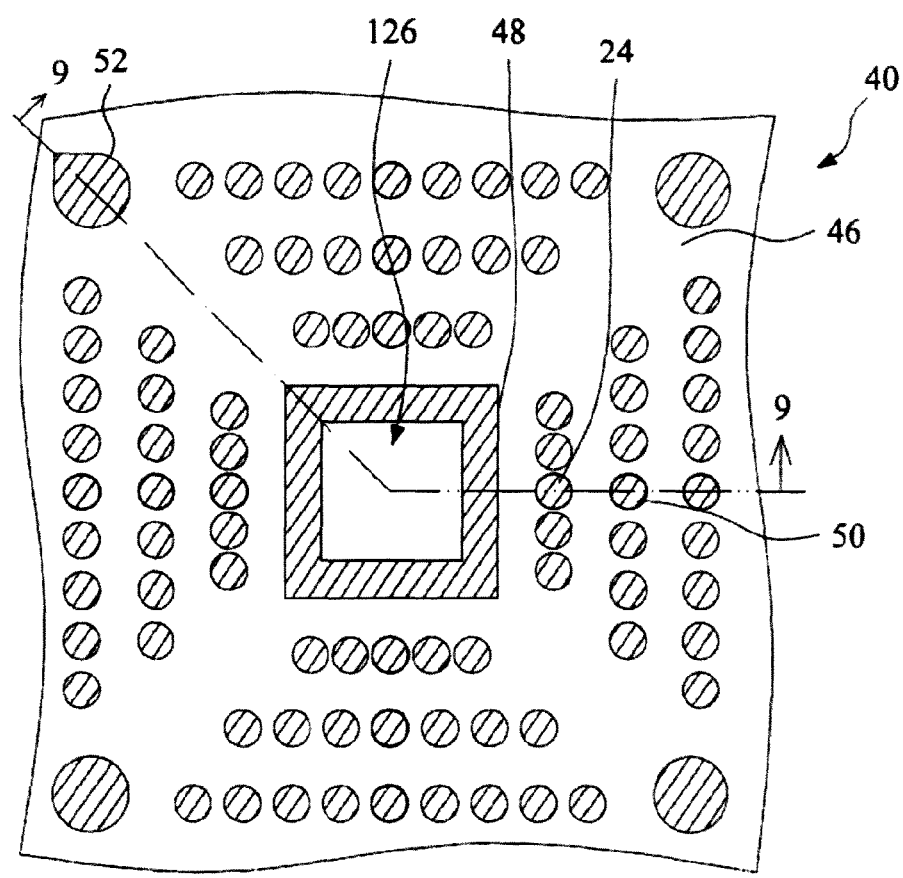
Figure 9:
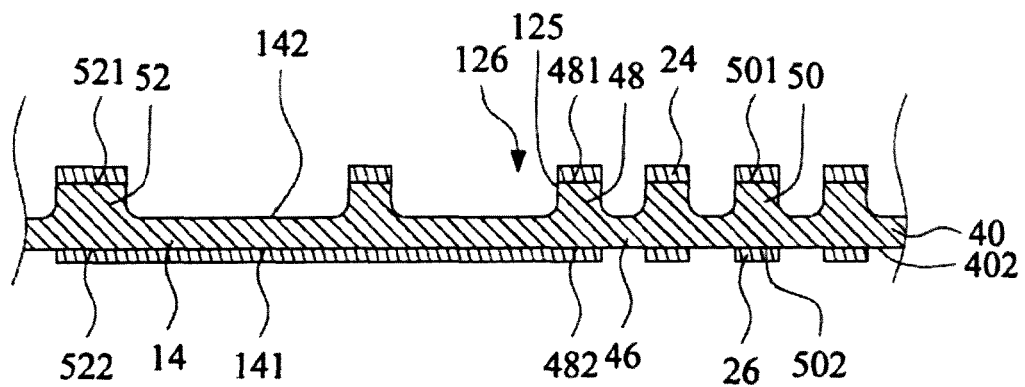

With reference to FIG. 6, the first metal layer 24 is formed in the first openings 421 and the second metal layer 26 is formed in the second openings 441. With reference to FIG. 7, the first photoresist layer 42 is stripped. With reference to FIGS. 8 and 9. FIG. 9 illustrates a cross-sectional side view of FIG. 8 taken along line 9-9. A half etching process using the metal layer 24 as a mask is performed on the upper surface 401 of the plate 40 so as to form a base 46, a central protrusion 48, a plurality of peripheral protrusions 50 and a plurality of supporting protrusions 52. The hatching in FIG. 8 indicates that the plate 40 has not been half etched.

With reference to FIG. 9, the base 46 has a plurality of connecting portions 14 for connecting the central protrusion 48 and the supporting protrusions 52. Each of the connecting portions 14 has an upper surface 142 and a lower surface 141 opposite one another. The central protrusion 48 has an upper surface 481 and a lower surface 482, and extends upwardly from the base 46 so as to define the cavity 126. The upper surface 142 of the connecting portion 14 is at a lower elevation than the upper surface 481 of the central protrusion 48 and coplanar with the bottom of the cavity 126. The lower surface 141 of the connecting portion 14 is coplanar with the lower surface 482 of the central protrusion 48. The central protrusion 48 further has an upper side wall 125 disposed adjacent to the upper surface 481 that faces toward the cavity 126. Each of the peripheral protrusions 50 has an upper surface 501 and a lower surface 502, extends upwardly from the base 46, and is disposed around the central protrusion 48. Each of the supporting protrusions 52 has an upper surface 521 and a lower surface 522, extends upwardly from the base 46, and is disposed around the central protrusion 48. The first metal coating 24 remains on the upper surface 481 of the central protrusion 48, the upper surfaces 501 of the peripheral protrusions 50 and the upper surfaces 521 of the supporting protrusions 52. The second metal coating 26 remains on the lower surface 402 of the plate 40 below the cavity 126, the lower surface 482 of the central protrusion 48, the lower surfaces 141 of the connecting portions 14, the lower surfaces 522 of the supporting protrusions 52 and the lower surfaces 502 of the peripheral protrusions 50. Then, the second photoresist layer 44 is stripped.

Figure 10:
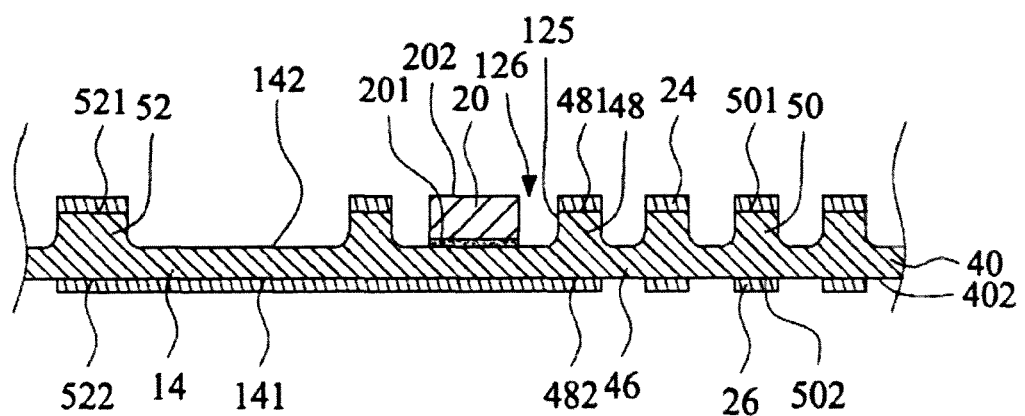
Figure 11:
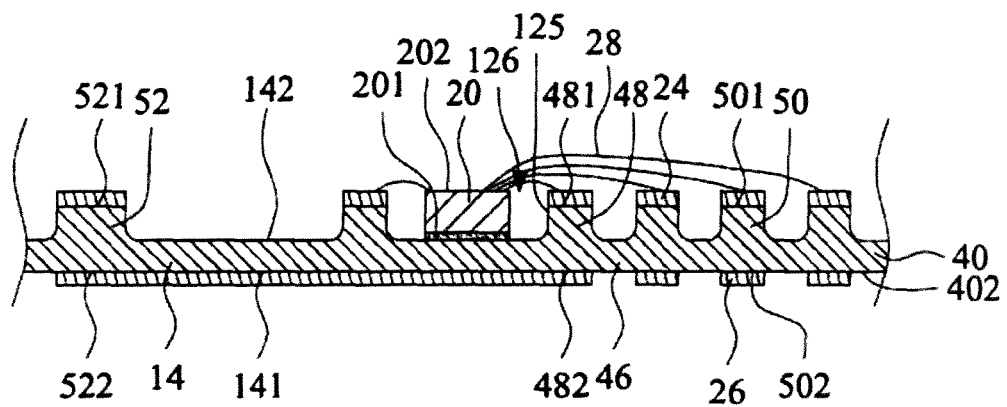

With reference to FIG. 10, the semiconductor chip 20 is attached to the bottom of the cavity 126 with the adhesive layer 201. With reference to FIG. 11, the active surface 202 of the semiconductor chip 20 is electrically connected to the peripheral protrusions 50 and the central protrusion 48 by the bonding wires 28.

Figure 12:
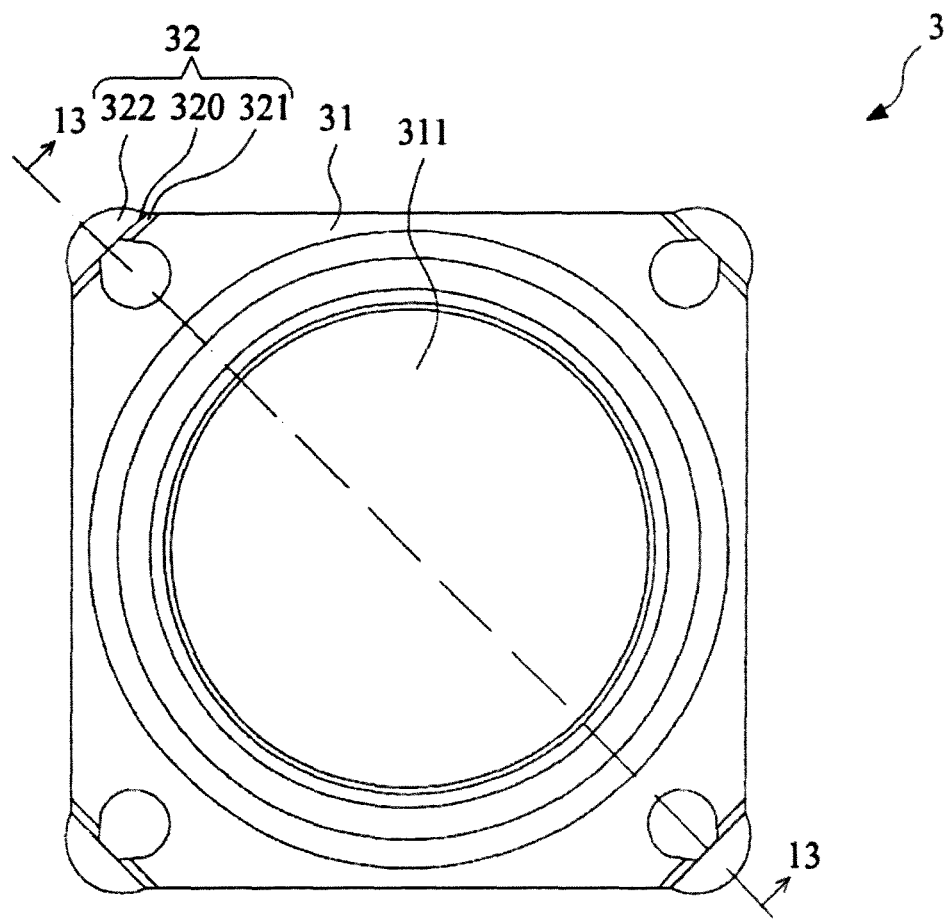
Figure 13:
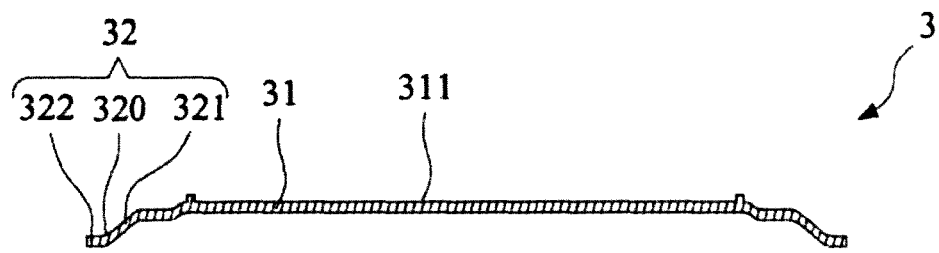
Figure 14:
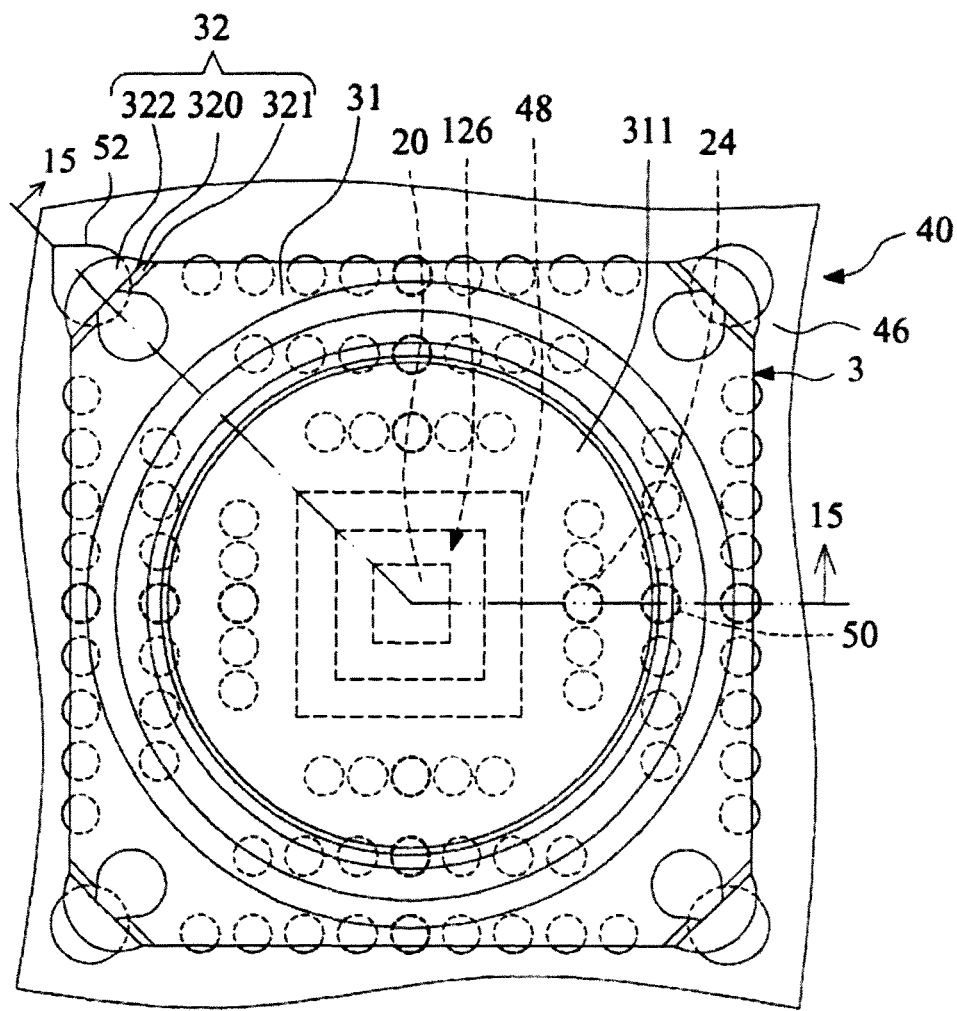
Figure 15:
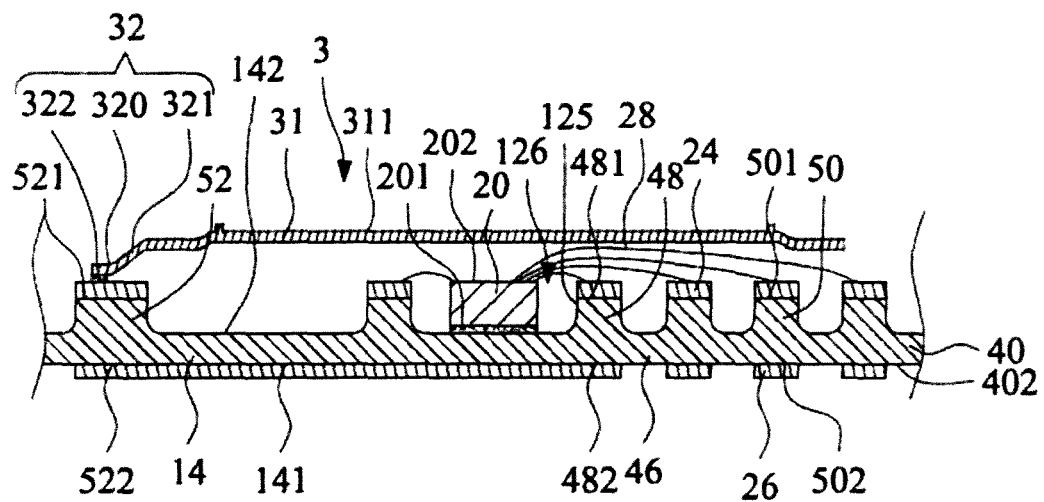

With reference to FIGS. 12-15, FIG. 13 is a cross-sectional side view of FIG. 12 taken along line 13-13, and FIG. 15 is a cross-sectional side view of FIG. 14 taken along line 15-15. The heat sink 3 is positioned on the plate 40 such that the main body 31 is disposed above the semiconductor chip 20, and the second portions 322 of the leg portions 32 are supported by the supporting protrusions 52. The semiconductor chip 20 is accommodated in the space defined by the main body 31 and the leg portion 32. The second portions 322 of the leg portions 32 are adhered to the supporting protrusions 52.

Figure 16:
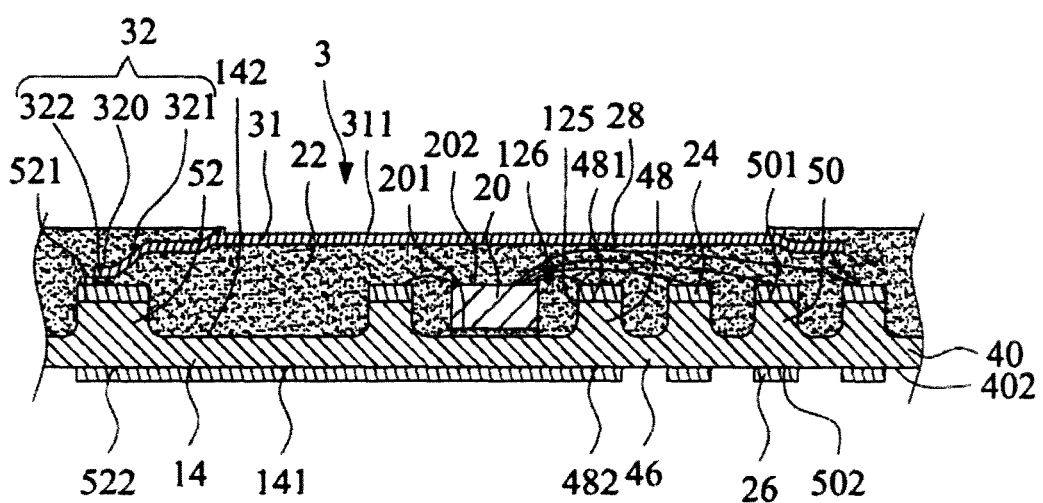

With reference to FIG. 16, a molding compound 22 is formed over the plate 40 so as to cover the semiconductor chip 20, the heat sink 3, the central protrusion 48, the peripheral protrusions 50, the supporting protrusions 52 and the first metal layer 24. In this embodiment, the upper surface 311 of the main body 31 of the heat sink 3 is not covered by the molding compound 22 and is exposed to the air.

Figure 17:
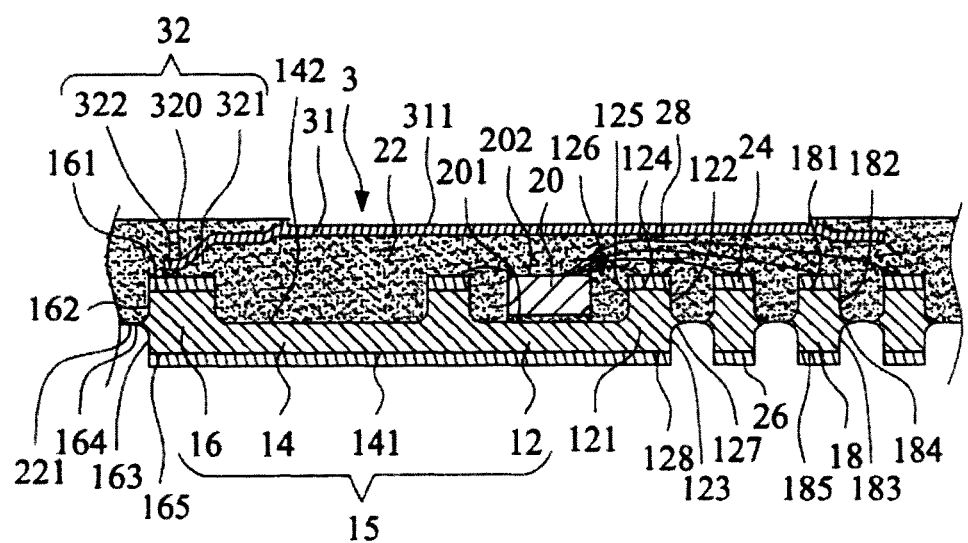

With reference to FIG. 17, the lower surface 402 of the plate 40 is etched using the second metal layer 26 as a mask so as to form the die pad 12, the connecting bars 14, the supporting portions 16 and the leads 18. After the etching process, the connecting bars 14 connect the die pad 12 and the supporting portions 16, and the leads 18 are disposed around the die pad 12 and electrically isolated from each other and the die pad 12. Then, a singulation process, such as sawing, is performed to obtain the semiconductor package 1 as shown in FIG. 1.

While the invention has been described and illustrated with reference to specific embodiments thereof, these descriptions and illustrations do not limit the invention. It should be understood by those skilled in the art that various changes may be made and equivalents may be substituted without departing from the true spirit and scope of the invention as defined by the appended claims. The illustrations may not be necessarily be drawn to scale. There may be distinctions between the artistic renditions in the present disclosure and the actual apparatus due to making processes and tolerances. There may be other embodiments of the present invention which are not specifically illustrated. The specification and the drawings are to be regarded as illustrative rather than restrictive. Modifications may be made to adapt a particular situation, material, composition of matter, method, or process to the objective, spirit and scope of the invention. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A semiconductor package, comprising:
   a die pad;

at least one connecting bar extending outwardly from the die pad;

at least one supporting portion extending from the at least one connecting bar at a location spaced from the die pad and including an upper surface that is elevated above an upper surface of the die pad;

a plurality of leads disposed around the die pad, and being electrically isolated from each other and the die pad;

a semiconductor chip disposed on the die pad and electrically connected to the leads;

a heat sink attached to the upper surface of the at least one supporting portion; and a molding compound encapsulating the semiconductor chip, at least portions of the heat sink, at least portions of the die pad, at least portions of the connecting bar, at least portions of the supporting portion, and at least portions of each of the leads;

wherein the die pad, the connecting bar, and the supporting portion are made of metal.

2. The semiconductor package of claim 1, wherein the die pad comprises a peripheral edge region defining a cavity in which the semiconductor chip is disposed.

3. The semiconductor package of claim 1, wherein each of the leads comprises:

an upper surface;

a lower surface;

an upper side wall disposed adjacent to the upper surface; and a lower side wall disposed adjacent to the lower surface;

wherein the molding compound encapsulates the upper side wall and exposes the lower side wall.

4. The semiconductor package of claim 1, wherein a lower surface of the at least one connecting bar is coplanar with a lower surface of the at least one supporting portion.

5. The semiconductor package of claim 1, wherein the at least one connecting bar extends outwardly from a lower surface of the molding compound.

6. The semiconductor package of claim 1, wherein a surface area of the at least one supporting portion is greater than that of each of the leads.

7. The semiconductor package of claim 1, wherein an upper surface of the heat sink is exposed from the molding compound.

8. The semiconductor package of claim 1, wherein the at least one supporting portion comprises a plurality of supporting portions disposed at corners of the semiconductor package.

9. The semiconductor package of claim 8, wherein the heat sink includes a main body and a plurality of leg portions, and the leg portions are attached to the upper surface of the supporting portions.

10. A semiconductor package, comprising:

a die pad;

at least one connecting bar extending outwardly from the die pad;

at least one supporting portion extending from the at least one connecting bar at a distal end from the die pad;

a plurality of leads disposed around the die pad, and being electrically isolated from each other and the die pad;

a semiconductor chip disposed on the die pad and electrically connected to the leads;

a heat sink attached to an upper surface of the at least one supporting portion, the heat sink comprising a main body portion and at least one leg portion; and a molding compound encapsulating the semiconductor chip, at least portions of the heat sink, at least portions of the die pad, at least portions of the connecting bar, at least portions of the supporting portion, and at least portions of each of the leads;

wherein a path for dissipating heat from the semiconductor chip comprises from the die pad through the at least one connecting bar, through the at least one supporting portion, through the at least one leg portion, and through the main body portion; and wherein the die pad, the connecting bar, and the supporting portion are made of metal.

11. The semiconductor package of claim 10, wherein the die pad comprises a peripheral edge region defining a cavity in which the semiconductor chip is disposed.

12. The semiconductor package of claim 10, wherein each of the leads further comprises an upper surface and a lower surface, an upper side wall having an upper sloped surface adjacent to the upper surface, and a lower side wall having a lower sloped surface adjacent to the lower surface, and wherein the molding compound encapsulates the upper sloped surfaces but leaves the lower sloped surfaces exposed.

13. The semiconductor package of claim 10, wherein a lower surface of the at least one connecting bar is coplanar with a lower surface of the at least one supporting portion.

14. The semiconductor package of claim 10, wherein the at least one connecting bar extends outwardly from a lower surface of the molding compound.

15. The semiconductor package of claim 10, wherein a surface area of the at least one supporting portion is greater than that of each of the leads.

16. The semiconductor package of claim 10, wherein an upper surface of the main body of the heat sink is exposed from the molding compound.

17. The semiconductor package of claim 10, wherein the at least one supporting portion includes an upper surface that is elevated above an upper surface of the die pad.

18. A semiconductor package, comprising:

a die pad having an upper surface;

at least one connecting bar extending outwardly from the die pad and having an upper surface in the same plane as the upper surface of the die pad;

at least one supporting portion extending upwardly from the at least one connecting bar at a location spaced from the die pad;

a plurality of leads disposed around the die pad, and being electrically isolated from each other and the die pad;

a semiconductor chip disposed on the die pad and electrically connected to the leads;

a molding compound encapsulating the semiconductor chip, at least portions of the die pad, at least portions of the connecting bar, at least portions of the supporting portion, and at least portions of each of the leads; and a heat sink attached to the at least one supporting portion;

wherein the die pad, the connecting bar, and the supporting portion are made of metal.

19. The semiconductor package of claim 18, wherein each of the leads comprises:

an upper surface;

a lower surface;

an upper side wall disposed adjacent to the upper surface; and a lower side wall disposed adjacent to the lower surface;

wherein the molding compound encapsulates the upper side wall and exposes the lower side wall.

* * * * *